United States Patent
Park et al.

(10) Patent No.: US 12,225,796 B2
(45) Date of Patent: Feb. 11, 2025

(54) ORGANIC LIGHT EMITTING DIODE DISPLAY

(71) Applicant: Samsung Display Co., LTD., Yongin-si (KR)

(72) Inventors: Jun Hyun Park, Suwon-si (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 797 days.

(21) Appl. No.: 16/925,186

(22) Filed: Jul. 9, 2020

(65) Prior Publication Data

US 2021/0043717 A1 Feb. 11, 2021

(30) Foreign Application Priority Data

Aug. 5, 2019 (KR) ......................... 10-2019-0094894

(51) Int. Cl.
*H10K 59/131* (2023.01)
(52) U.S. Cl.
CPC ................................ *H10K 59/1315* (2023.02)
(58) Field of Classification Search
CPC ........... H10K 59/1315; H10K 59/1795; G09G 2310/00–0297; G02F 1/1345; G02F 1/13452
See application file for complete search history.

(56) References Cited

U.S. PATENT DOCUMENTS

| | | | |
|---|---|---|---|
| 8,913,045 B2 | 12/2014 | Son et al. | |
| 10,504,467 B2 | 12/2019 | Kim et al. | |
| 2017/0124945 A1 | 5/2017 | Ahn et al. | |
| 2017/0200420 A1* | 7/2017 | No ...................... | G06F 13/1689 |

(Continued)

FOREIGN PATENT DOCUMENTS

| JP | 2017173505 A | 9/2017 |
|---|---|---|
| KR | 1020000003630 | 1/2000 |

(Continued)

OTHER PUBLICATIONS

Korean Office Action—Korean Patent Application No. 10-2019-0094894 dated Aug. 22, 2023, citing references listed within.

*Primary Examiner* — Eric K Ashbahian
(74) *Attorney, Agent, or Firm* — CANTOR COLBURN LLP

(57) ABSTRACT

An organic light emitting diode display includes a clock wiring circuit including a first signal line and a second signal line, a resistance adjusting circuit including a first lower resistance line and a first upper resistance line connected to the first signal line and a second lower resistance line and a second upper resistance line connected to the second signal line, and a gate driving circuit connected to the resistance adjusting circuit. The second signal line is disposed closer to the gate driving circuit than the first signal line, the first lower resistance line and the second lower resistance line have higher resistivity than the first upper resistance line and the second upper resistance line, respectively, the first lower resistance line is shorter than the second lower resistance line, and the first upper resistance line is longer than the second upper resistance line.

18 Claims, 13 Drawing Sheets

(56) References Cited

U.S. PATENT DOCUMENTS

| | | | | |
|---|---|---|---|---|
| 2017/0309242 | A1* | 10/2017 | Kim | H01L 29/78633 |
| 2018/0337226 | A1* | 11/2018 | Liu | H10K 50/81 |
| 2020/0381653 | A1* | 12/2020 | Bang | H10K 50/844 |
| 2021/0200013 | A1* | 7/2021 | Li | G09G 3/20 |
| 2021/0286034 | A1 | 9/2021 | Hanada | |

FOREIGN PATENT DOCUMENTS

| | | |
|---|---|---|
| KR | 1020170120238 | 10/2017 |
| WO | 2018021024 A1 | 2/2018 |

* cited by examiner

ORGANIC LIGHT EMITTING DIODE DISPLAY

This application claims priority to Korean Patent Application No. 10-2019-0094894, filed on Aug. 5, 2019, and all the benefits accruing therefrom under 35 U.S.C. § 119, the content of which in its entirety is herein incorporated by reference.

BACKGROUND

(a) Field

The present disclosure relates to an organic light emitting diode display.

(b) Description of the Related Art

As a device for displaying an image, a widely used display device includes a liquid crystal display and an organic light emitting diode display.

The liquid crystal display and the organic light emitting diode display include a display panel including a switching element and a display signal line, a printed circuit board ("FPBC") for turning the switching element on and off by transferring a signal to the display signal line, a signal controller, and the like.

A gate driver is connected to a gate line that applies a gate signal to the display panel, and transfers a signal applied by the signal controller to the gate line.

The signal controller processes image data inputted from the outside, generates a signal for controlling the gate driver, the data driver, and the like, and applies the signal to the gate driver and the data driver.

SUMMARY

Exemplary embodiments have been made in an effort to effectively solve a driving signal delay while maintaining areas of a resistance adjusting circuit and a gate circuit in a resistance adjusting circuit for driving signal delay between a driving signal circuit and the gate circuit of an organic light emitting diode display.

An exemplary embodiment of the invention provides an organic light emitting diode display including a substrate which includes a display area and a non-display area, an organic light emitting diode disposed in the display area, a plurality of transistors connected to the organic light emitting diode and disposed in the display area, and a gate driver disposed in the non-display area, where the gate driver includes a clock wiring circuit which includes a first signal line and a second signal line extending in a first direction, respectively, a resistance adjusting circuit which includes a first lower resistance line and a first upper resistance line connected to the first signal line, respectively, and a second lower resistance line and a second upper resistance line connected to the second signal line, respectively, and a gate driving circuit connected to the resistance adjusting circuit and which includes a plurality of stages for applying a gate signal. The second signal line is disposed closer to the gate driving circuit than the first signal line, the first lower resistance line has higher resistivity than the first upper resistance line, and the second lower resistance line has higher resistivity than the second upper resistance line, the first lower resistance line is shorter than the second lower resistance line, and the first upper resistance line is longer than the second upper resistance line.

In an exemplary embodiment, each of the first lower resistance line and the second lower resistance line may include a winding concave-convex portion.

In an exemplary embodiment, the organic light emitting diode display may further include a first signal connection line which extends in a second direction perpendicular to the first direction and electrically connected to the first signal line, and the first lower resistance line may correspond to a portion of the first signal connection line included in the resistance adjusting circuit.

In an exemplary embodiment, the organic light emitting diode display may further include an insulating layer disposed on the first lower resistance line, and an interlayer insulating layer disposed on the insulating layer, and the first lower resistance line may be positioned between the substrate and the insulating layer, while the first upper resistance line may be positioned on the interlayer insulating layer.

In an exemplary embodiment, the first lower resistance line may be electrically connected to the first upper resistance line through an opening defined in the insulating layer and the interlayer insulating layer.

In an exemplary embodiment, the organic light emitting diode display may further include a second signal connection line which extends in a second direction perpendicular to the first direction and electrically connected to the second signal line, and the second lower resistance line may correspond to a portion of the second signal connection line included in the resistance adjusting circuit.

In an exemplary embodiment, the organic light emitting diode display may further include an insulating layer disposed on the second lower resistance line, an interlayer insulating layer disposed on the second upper resistance line, and a resistance line connector disposed on the interlayer insulating layer, wherein the second lower resistance line may be positioned between the substrate and the insulating layer, and the second upper resistance line may be disposed between the insulating layer and the interlayer insulating layer.

In an exemplary embodiment, the second lower resistance line may be electrically connected to the resistance line connector through an opening defined in the insulating layer and the interlayer insulating layer, and the second upper resistance line may be electrically connected to the resistance line connector through an opening defined in the interlayer insulating layer.

An exemplary embodiment of the invention provides an organic light emitting diode display including a substrate which includes a display area and a non-display area, an organic light emitting diode disposed in the display area, a plurality of transistors connected to the organic light emitting diode and disposed in the display area, and a gate driver disposed in the non-display area, where the gate driver includes a clock wiring circuit which includes a first signal line and a second signal line extending in a first direction, a resistance adjusting circuit which includes a first resistance line connected to the first signal line and a second resistance line connected to the second signal line, and a gate driving circuit connected to the resistance adjusting circuit and which includes a plurality of stages for applying a gate signal. The second signal line is disposed closer to the gate driving circuit than the first signal line, each of the first resistance line and the second resistance line includes a winding concave-convex portion, and a length of the concave-convex portion of the first resistance line is shorter than that of the concave-convex portion of the second resistance line.

In an exemplary embodiment, the organic light emitting diode display may further include a first signal connection line which extend in a second direction that is perpendicular to the first direction and electrically connected to the first signal line, and the first resistance line may correspond to a portion of the first signal connection line included in the resistance adjusting circuit.

In an exemplary embodiment, the organic light emitting diode display may further include a second signal connection line which extends in a second direction perpendicular to the first direction and electrically connected to the second signal line, and the second resistance line may correspond to a portion of the second signal connection line included in the resistance adjusting circuit.

In an exemplary embodiment, the organic light emitting diode display may further include an insulating layer disposed on the substrate, and an interlayer insulating layer disposed on the insulating layer, and the first resistance line or the second resistance line may be disposed between the substrate and the insulating layer or disposed on the insulating layer.

In an exemplary embodiment, the organic light emitting diode display may further include a gate wiring circuit disposed in the non-display area, and the gate wiring circuit may be electrically connected to the stage and applies the gate signal transferred from the stage to the pixel.

An exemplary embodiment of the invention provides an organic light emitting diode display including a substrate which includes a display area and a non-display area, a first lower resistance line and a second lower resistance line disposed in the non-display area, an insulating layer disposed on the first lower resistance line and the second lower resistance line, an upper resistance line disposed on the insulating layer, and an interlayer insulating layer disposed on the upper resistance line, where the upper resistance line includes a first upper resistance line positioned on the interlayer insulating layer and a second upper resistance line positioned on the insulating layer, and the first lower resistance line has higher resistivity than the first upper resistance line, and the second lower resistance line has higher resistivity than the second upper resistance line.

In an exemplary embodiment, the organic light emitting diode display may further include a first signal line positioned on the interlayer insulating layer, and a first signal connection line electrically connected to the first signal line, wherein the first signal connection line may be disposed on a same layer as the first lower resistance line, and the first lower resistance line may correspond to a portion of the first signal connection line.

In an exemplary embodiment, the first lower resistance line may be electrically connected to the first upper resistance line through an opening defined in the insulating layer and the interlayer insulating layer.

In an exemplary embodiment, the organic light emitting diode display may further include a second signal line positioned on the interlayer insulating layer, and a second signal connection line that is electrically connected to the second signal line, wherein the second signal connection line may be disposed on a same layer as the second lower resistance line, and the second lower resistance line may correspond to a portion of the second signal connection line.

In an exemplary embodiment, the organic light emitting diode display may further include a resistance line connector disposed on the interlayer insulating layer, the second lower resistance line may be electrically connected to the resistance line connector through an opening defined in the insulating layer and the interlayer insulating layer, and the second upper resistance line may be electrically connected to the resistance line connector through an opening defined in the interlayer insulating layer.

In an exemplary embodiment, the organic light emitting diode display may further include a carry clock signal line and a plurality of global clock signal lines disposed in the interlayer insulating layer, respectively, the sensing signal may be transferred to the first signal line, and the scan signal may be transferred to the second signal line.

In an exemplary embodiment, the organic light emitting diode display may further include a carry signal resistance line positioned between the substrate and the insulating layer, a gate upper resistance line disposed on the insulating layer, an interlayer insulating layer disposed on the gate upper resistance line, and a gate connector disposed on the interlayer insulating layer, wherein the carry signal resistance line may be electrically connected to the gate upper resistance line through an opening defined in the insulating layer, and the gate upper resistance line may be electrically connected to the gate connector through an opening defined in the interlayer insulating layer.

According to exemplary embodiments, delay of the driving signal may be prevented by using wires having different resistivity for the resistance adjusting circuit of the gate driver while maintaining constant areas of the resistance adjusting circuit and the gate circuit.

That is, since a delay deviation of the signal applied to the display area is reduced, problems such as horizontal streaks due to a difference in signal delay may be improved, and display quality may be improved.

In addition, by adjusting lengths of the wires having different resistivity in the resistance adjusting circuit of the gate driver, it is possible to solve the driving signal delay of the sensing signal and the scan signal.

DETAILED DESCRIPTION

Figure 1:
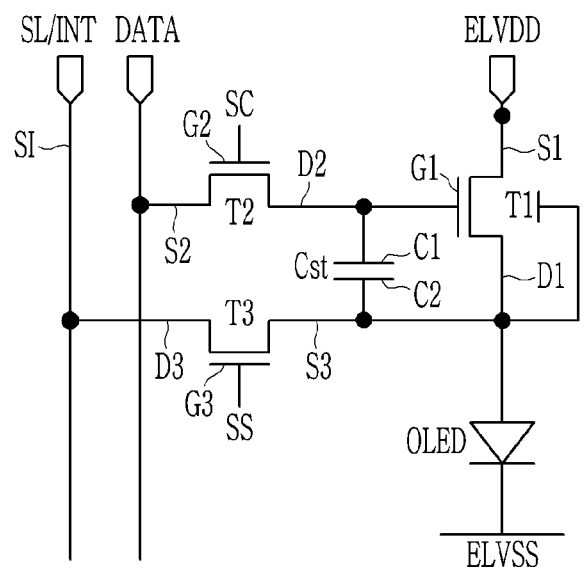
FIG. 1 illustrates an equivalent circuit diagram of a pixel of a display device according to an exemplary embodiment.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent elements shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Hereinafter, an organic light emitting diode display including a clock wire according to an exemplary embodiment will be described in detail.

First, FIG. 1 illustrates an equivalent circuit diagram of one pixel of an organic light emitting diode display according to an exemplary embodiment.

Referring to FIG. 1, a display device according to an exemplary embodiment includes a plurality of pixels, and one pixel includes a plurality of transistors T1, T2, and T3, a capacitor Cst, and at least one organic light emitting diode OLED connected to the plurality of transistors. Hereinafter, an example in which one pixel PX includes one organic light emitting diode OLED will be mainly described.

The transistors T1, T2, and T3 include a first transistor T1, a second transistor T2, and a third transistor T3. A source electrode and a drain electrode, which will be described below, are used to distinguish two electrodes disposed on opposite sides of a channel of each of the transistors T1, T2, and T3, and they may be interchanged.

The gate electrode G1 of the first transistor T1 is connected to a first electrode C1 of the capacitor Cst. A source electrode S1 of the first transistor T1 is connected to a driving voltage line for transferring a driving voltage ELVDD. A drain electrode D1 of the first transistor T1 is connected to an anode of the organic light emitting diode OLED and a second electrode C2 of the capacitor Cst. The first transistor T1 may receive a data voltage DATA depending on a switching operation of the second transistor T2, may store the data voltage DATA in the capacitor Cst, and may supply a driving current to the organic light emitting diode OLED depending on the stored voltage.

A gate electrode G2 of the second transistor T2 is connected to the first scan line that transfers a scan signal SC. A source electrode S2 of the second transistor T2 is connected to a data line capable of transferring the data voltage DATA or the reference voltage. A drain electrode D2 of the second transistor T2 is connected to the first electrode C1 of the capacitor Cst and the gate electrode G1 of the first transistor T1. The second transistor T2 is turned on depending on the scan signal SC to transfer the reference voltage or data voltage DATA to the gate electrode G1 of the first transistor T1 and the first electrode C1 of the capacitor Cst.

A gate electrode G3 of the third transistor T3 is connected to the sensing line transferring a sensing signal SS. A source electrode S3 of the third transistor T3 is connected to the second electrode C2 of the capacitor Cst, the drain electrode D1 of the first transistor T1, and the anode of the organic light emitting diode OLED. A drain electrode D3 of the third transistor T3 is connected to a sensing/initialization voltage line SI which transfers a sensing voltage SL or an initialization voltage INT. The third transistor T3 is turned on in response to the sensing signal SS to transfer the initialization voltage INT to the anode of the organic light emitting diode OLED and the second electrode C2 of the capacitor Cst, such that a voltage of the anode of the organic light emitting diode OLED may be initialized.

The first electrode C1 of the capacitor Cst is connected to the gate electrode G1 of the first transistor T1. The second electrode C2 thereof is connected to the source electrode S3 of the third transistor T3 and the anode of the organic light emitting diode OLED. A cathode of the organic light emitting diode OLED is connected to the common voltage line which transfers the common voltage ELVSS.

The organic light emitting diode OLED may emit light depending on a driving current outputted from the first transistor T1.

Figure 2:
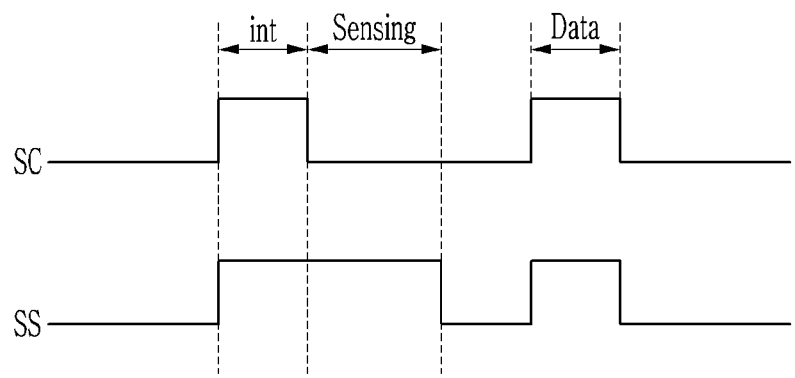
FIG. 2 illustrates a timing chart of a signal applied to one pixel of a light emitting diode display according to an exemplary embodiment.

The following describes an example of an operation of the circuit illustrated in FIG. 1 with reference to FIG. 2, in particular an example of the operation during one frame.

FIG. 2 illustrates a timing chart of a signal applied to one pixel of a light emitting diode display according to an exemplary embodiment. Herein, a case in which the transistors T1, T2, and T3 are N-type transistors will be described as an example, but the invention is not limited thereto.

When one frame is started, the scan signal SC of a high level and the sensing signal SS of a high level are supplied in an initialization period ("int" in FIG. 2) so as to turn on the second transistor T2 and the third transistor T3. The reference voltage from the data line is supplied to the gate electrode G1 of the first transistor T1 and the first electrode C1 of the capacitor Cst through the turned-on second transistor T2. The initialization voltage INT is applied to the second electrode C2 of the capacitor Cst, the drain electrode D1 of the first transistor T1, and the anode of the organic light emitting diode OLED through the turned-on third transistor T3. Accordingly, the drain electrode D1 of the first transistor T1 and the anode of the organic light emitting diode OLED are initialized to the initialization voltage INT during the initialization period. In this case, a difference voltage between the reference voltage and the initialization voltage INT is stored in the capacitor Cst.

Next, when the scan signal SC is at the low level while the high-level sensing signal SS is maintained in the sensing period ("Sensing" in FIG. 2), the third transistor T3 is maintained to be turned on, and the second transistor T2 is turned off. In this case, although the third transistor T3 is turned on, the initialization voltage INT may no longer be applied in the sensing period, unlike the initialization period, and a threshold voltage of the first transistor T1 may be prepared to be detected. In addition, since the second transistor T2 is turned off, the voltage stored at the two electrodes of the capacitor Cst is maintained. As a result, the reference voltage from the data line is applied to the gate electrode G1 of the first transistor T1, and the driving voltage ELVDD is applied to the source electrode S1, thereby outputting an output current to the drain electrode D1. The first transistor T1 outputs a current from the source electrode S1 to the drain electrode D1, and is turned off when the voltage of the drain electrode D1 becomes a drain electrode's reference voltage (hereinafter "reference voltage-Vth"). This is because, when a voltage difference between the gate electrode G1 and the drain electrode D1 (hereinafter "voltage-Vgd") becomes the threshold voltage of the first transistor T1, the channel near the drain electrode D1 disappears. Therefore, the reference voltage-Vth becomes a voltage of the second electrode C2 of the capacitor Cst, and the voltage difference between the two electrodes of the capacitor Cst becomes the threshold voltage of the first transistor T1. The sensing/initialization voltage line SI senses the voltage of the second electrode C2 of the capacitor Cst, which is the reference voltage-Vth. Since the reference voltage from the data line is known, the threshold voltage of the first transistor T1 may be checked. In this case, the common voltage ELVSS may have a high voltage to prevent a current from flowing through the organic light emitting diode OLED and preventing the organic light emitting diode OLED from emitting light. A characteristic deviation of the first transistor T1 which may be different for each pixel may be externally compensated by generating a data signal that is compensated by reflecting characteristic information sensed for the sensing period.

Next, when the high-level scan signal SC and the high level sensing signal SS are supplied in the data input period ("Data" in FIG. 2), the second transistor T2 and the third transistor T3 are turned on. The data voltage DATA from the data line is supplied to the gate electrode G1 of the first transistor T1 and the first electrode C1 of the capacitor Cst through the turned-on second transistor T2. In this case, the initialization voltage INT is applied to the second electrode C2 of the capacitor Cst, the drain electrode D1 of the first transistor T1, and the anode of the organic light emitting diode OLED such that the applied data voltage DATA may be stored in the first electrode C1 of the capacitor Cst consistently for each pixel.

Next, the first transistor T1, which is turned on by the data voltage DATA transferred to the gate electrode G1 for a light emitting period, generates a driving current depending on the data voltage DATA, and the driving current may allow the organic light emitting diode OLED to emit light.

According to an exemplary embodiment, the high level scan signal SC and the high level sensing signal SS are supplied in the data input period, and thus the organic light emitting diode OLED should be turned on at the same timing. In this case, if the timing is different, a signal delay may occur, so an equivalent resistance design is required to simultaneously apply the scan signal and the sensing signal. Details of the equivalent resistance design will be described with reference to FIG. 7 to FIG. 13.

Hereinafter, the gate driver of the organic light emitting diode display will be described before the equivalent resistance design is described.

Figure 3:
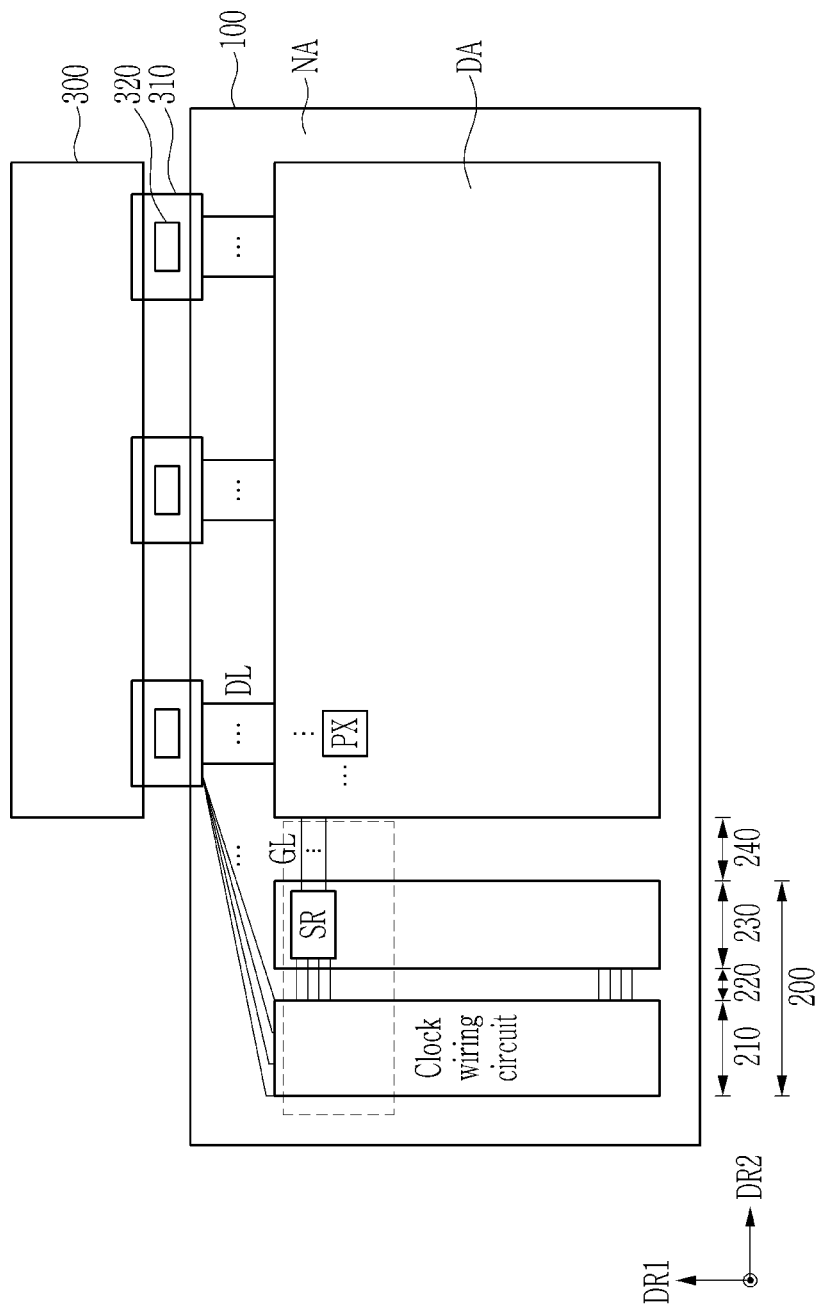
FIG. 3 illustrates a plan view of a display device according to an exemplary embodiment.
Figure 4:
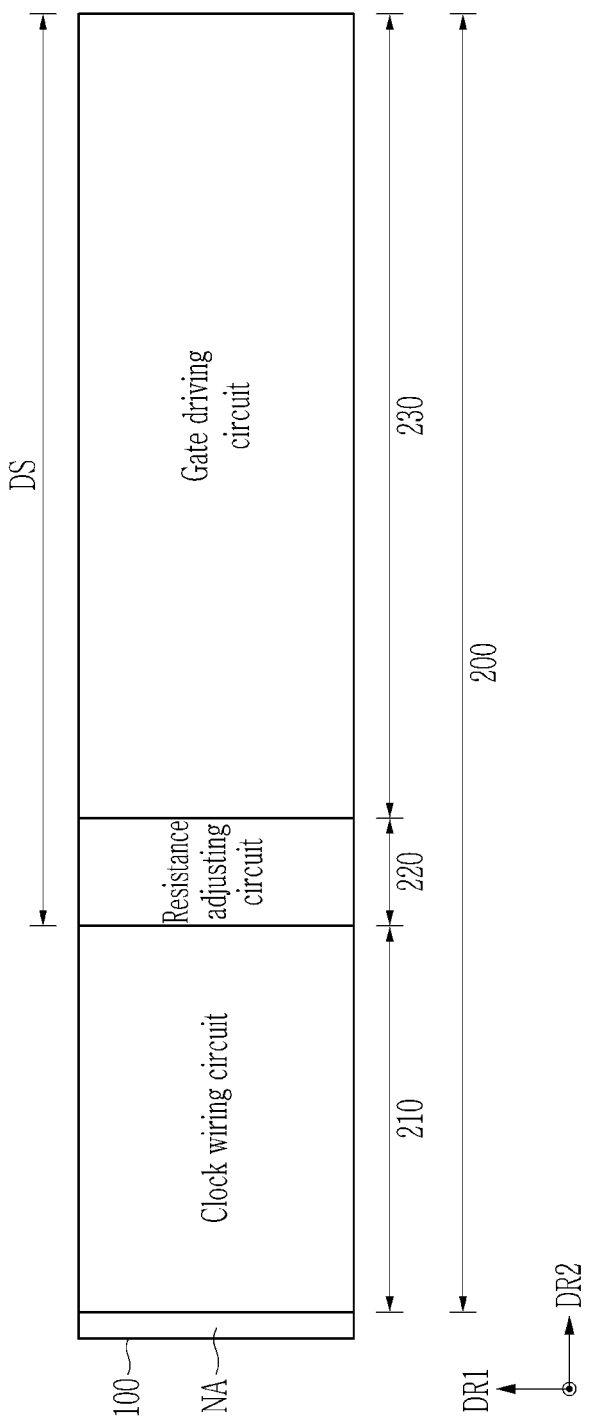
FIG. 4 schematically illustrates the gate driver of FIG. 2.

FIG. 3 illustrates a plan view of an organic light emitting diode display including the pixel of FIG. 1 according to an exemplary embodiment, and FIG. 4 schematically illustrates the gate driver of FIG. 3.

Referring to FIG. 3, the organic light emitting diode display includes a substrate 100, a gate driver 200, a printed circuit board ("PCB") 300, a flexible printed circuit board ("FPCB") 310, and a data driver 320.

The substrate 100 includes a display area DA and a non-display area NA. The display area DA is a portion for displaying an image thereon, and the display area DA includes a pixel PX including a thin film transistor, an organic light emitting diode OLED, and the like. The non-display area NA is a portion where an image is not displayed. The gate lines GL, portions of the data lines DL, the gate driver 200, and the like for applying a voltage and a signal to the pixel PX in the display area DA are formed in the non-display area NA. A first side of the non-display area NA may be connected to the printed circuit board 300 by being bonded to the FPCB 310. The data driver 320 mounted on the FPCB 310 applies a data signal to the data lines DL. Although not illustrated in FIG. 3, the data lines DL for connecting to the pixel PX may extend in a first direction DR1, and the gate lines GL may extend in a second direction DR2.

The gate driver 200 serves to apply a gate signal to the gate lines GL, and is disposed along the first direction DR1 at a first side of the non-display area NA.

The printed circuit board 300 disposed at a first side of the FPCB 310 may include a signal controller (not illustrated). The signal controller generates various signals for displaying an image in the display area DA, and transmits control signals to the gate driver 200 and the data driver 320 to control the gate driver 200 and the data driver 320, respectively.

Referring to FIG. 4, the gate driver 200 includes a clock wiring circuit 210, a resistance adjusting circuit 220, a gate driving circuit 230, and a gate wiring circuit 240. The gate driver 200 may be integrated in the non-display area NA.

Figure 6:
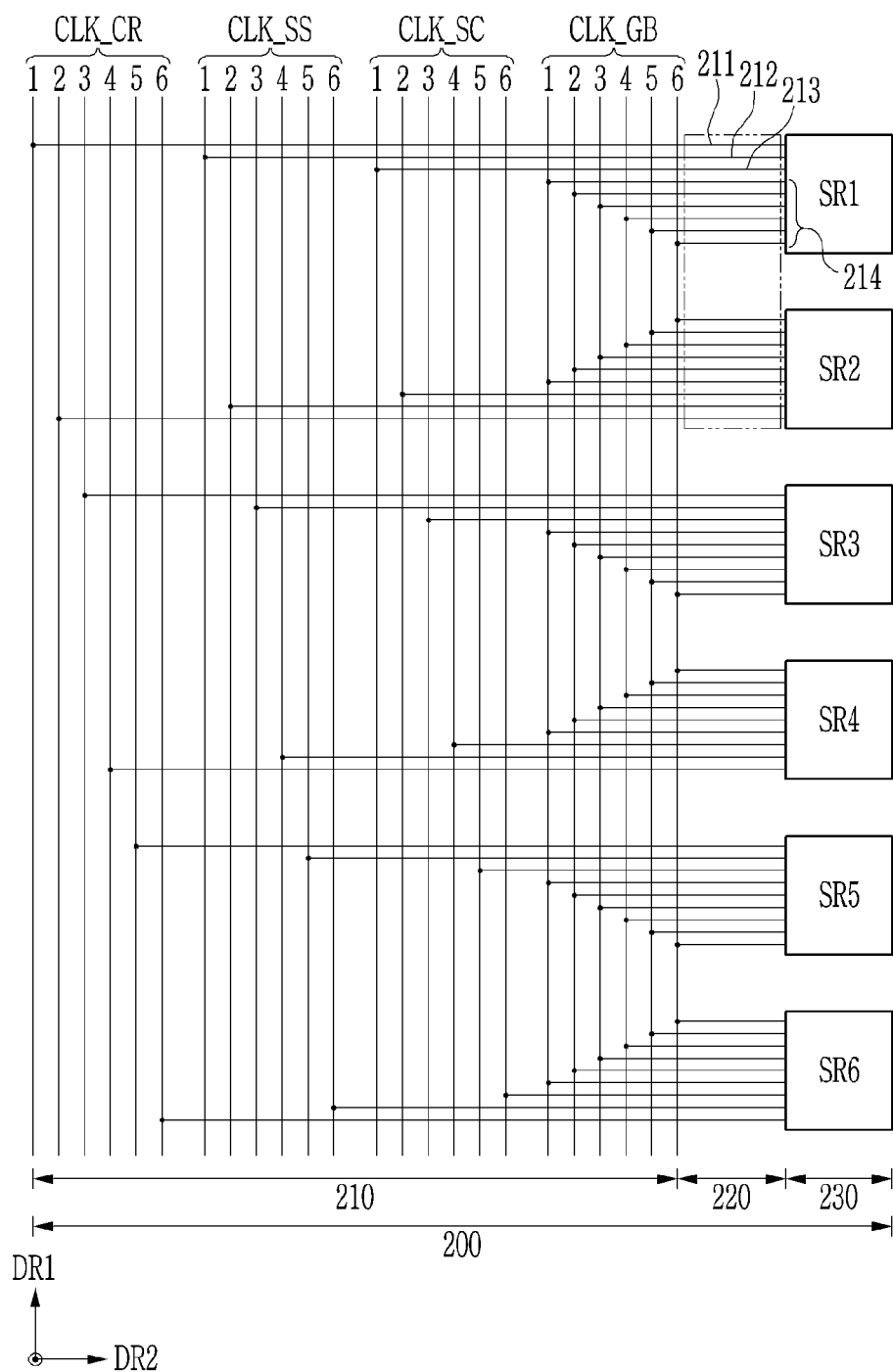
FIG. 6 illustrates a connection relationship between a clock wiring circuit and a gate driving circuit in a gate driver according to an exemplary embodiment.

The clock wiring circuit 210 includes a plurality of carry clock signal lines CLK_CR, a plurality of sensing clock signal line CLK_SS, a plurality of scan clock signal line CLK_SC, and a plurality of global clock signal line CLK_GB (Refers to FIG. 6).

The resistance adjusting circuit 220 is disposed at a first side of the clock wiring circuit 210, and is disposed along the first direction DR1. The resistance adjusting circuit 220 includes signal connection lines that are connected to signal lines such as a carry clock signal line CLK_CR, a sensing clock signal line CLK_SS, a scan clock signal line CLK_SC, and a global clock signal line CLK_GB. In addition, a signal deviation is reduced in the gate driving circuit 230 to be described later by disposing resistance wires having different resistivity, or having same resistivity but different lengths with respect to the sensing clock signal line CLK_SS and the scan clock signal line CLK_SC.

The gate driving circuit 230 is disposed at a first side of the resistance adjusting circuit 220, and is disposed along the first direction DR1. The gate driving circuit 230 includes a plurality of stages SR for sequentially outputting gate signals. Each of the stages SR may be connected to several gate lines GL to output a gate signal to the pixel PX.

The gate wiring circuit 240 includes several gate lines GL connected to each stage SR of the gate driving circuit 230. The gate lines GL apply a gate signal to each pixel PX by several stages SR. In another exemplary embodiment, the gate wiring circuit 240 may not be included in the gate driver 200, but may be included in one configuration of the display area DA.

Hereinafter, the gate driver of the organic light emitting diode display according to an exemplary embodiment will be described in detail with reference to FIG. 5.

Figure 5:
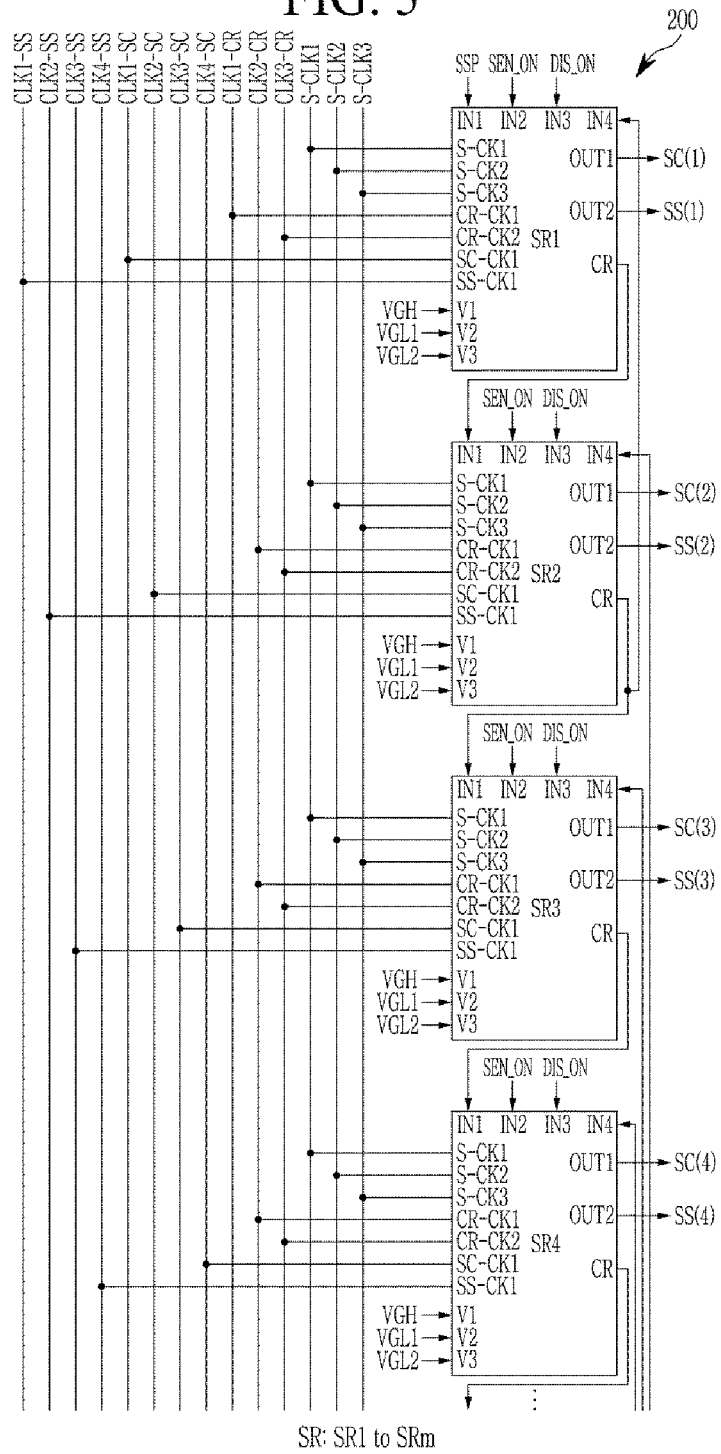
FIG. 5 illustrates a block diagram of a gate driver according to an exemplary embodiment.

FIG. 5 illustrates a block diagram of a gate driver according to an exemplary embodiment.

Referring to FIG. 5, the gate driver 200 includes a shift register including first to m$^{th}$ stages SR1 to SRm that are dependently connected to each other.

Each of the stages includes first and second carry clock terminals CR-CK1 and CR-CK2, a first scan clock terminal SC-CK1, first to third global clock terminals S_CK1, S_CK2 and S_CK3, a first input terminal IN1, a second input terminal IN2, a third input terminal IN3, a fourth input terminal IN4, and a first voltage input terminal V1, a second voltage input terminal V2, a third voltage input terminal V3, a first output terminal OUT1, a second output terminal OUT2, and a third output terminal CR.

The first and second carry clock terminals CR-CK1 and CR-CK2 receive a carry clock signal CLK_CR. For example, the first carry clock terminal CR-CK1 of the first stage SR1 receives a first carry clock signal CLK1_CR, and the second carry clock terminal CR-CK2 receives a second carry clock signal CLK2_CR.

The first scan clock terminal SC-CK1 receives a scan clock signal. For example, the first scan clock terminals SC-CK1 of the first to fourth stages SR1, SR2, SR3, and SR4 receive first to fourth scan clock signals CLK1_SC, CLK2_SC, CLK3_SC, and CLK4_SC, respectively.

The first sensing clock terminal SS-CK1 receives a sensing clock signal. For example, the first sensing clock terminals SS-CK1 of the first to fourth stages SR1, SR2, SR3, and SR4 receive first to fourth sensing clock signals CLK1_SS, CLK2_SS, CLK3_SS, and CLK4_SS, respectively.

Figure 10:
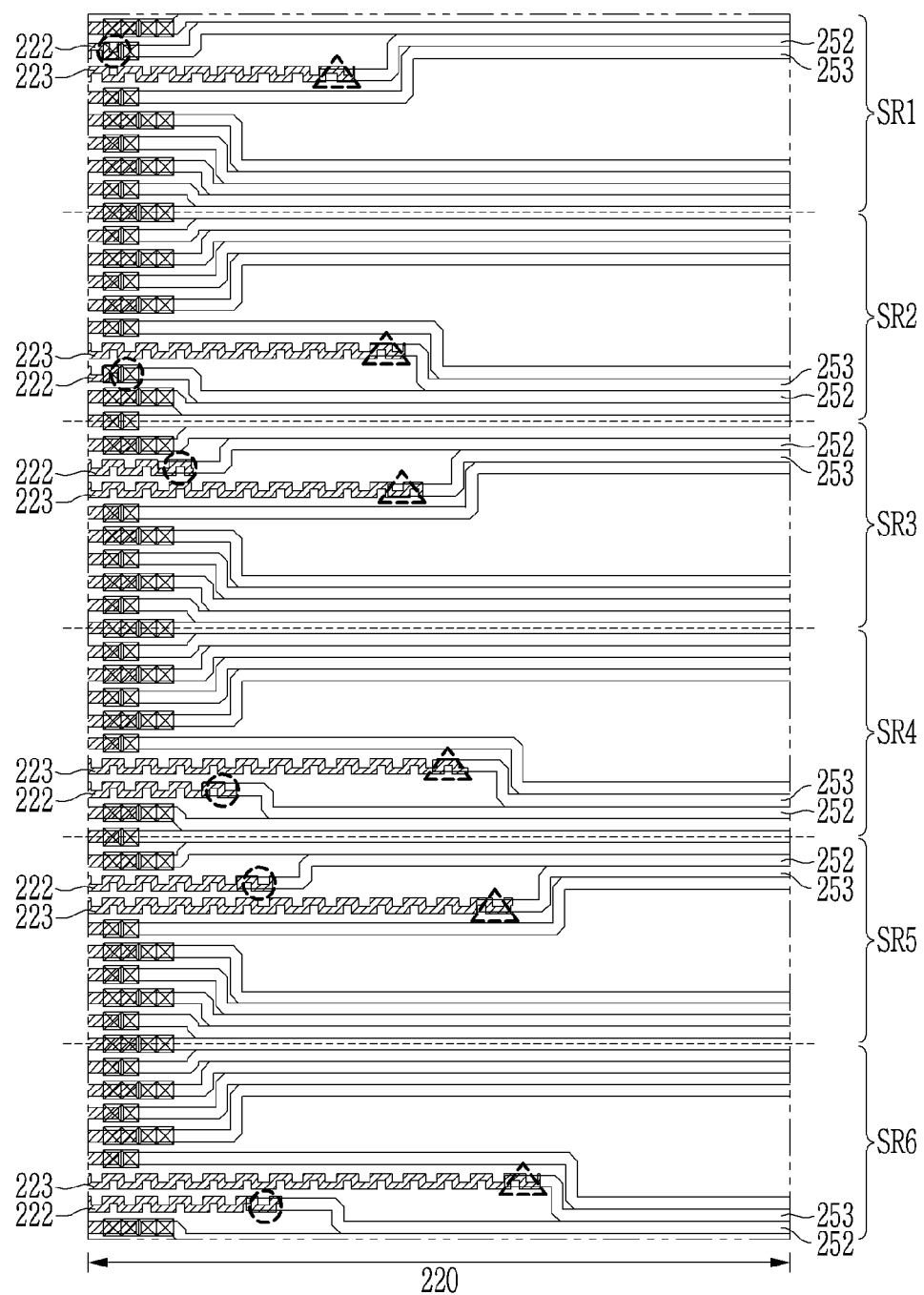
FIG. 10 illustrates a plan view of a partial region in a case where a resistance adjusting circuit includes wires having different resistivity.
Figure 12:
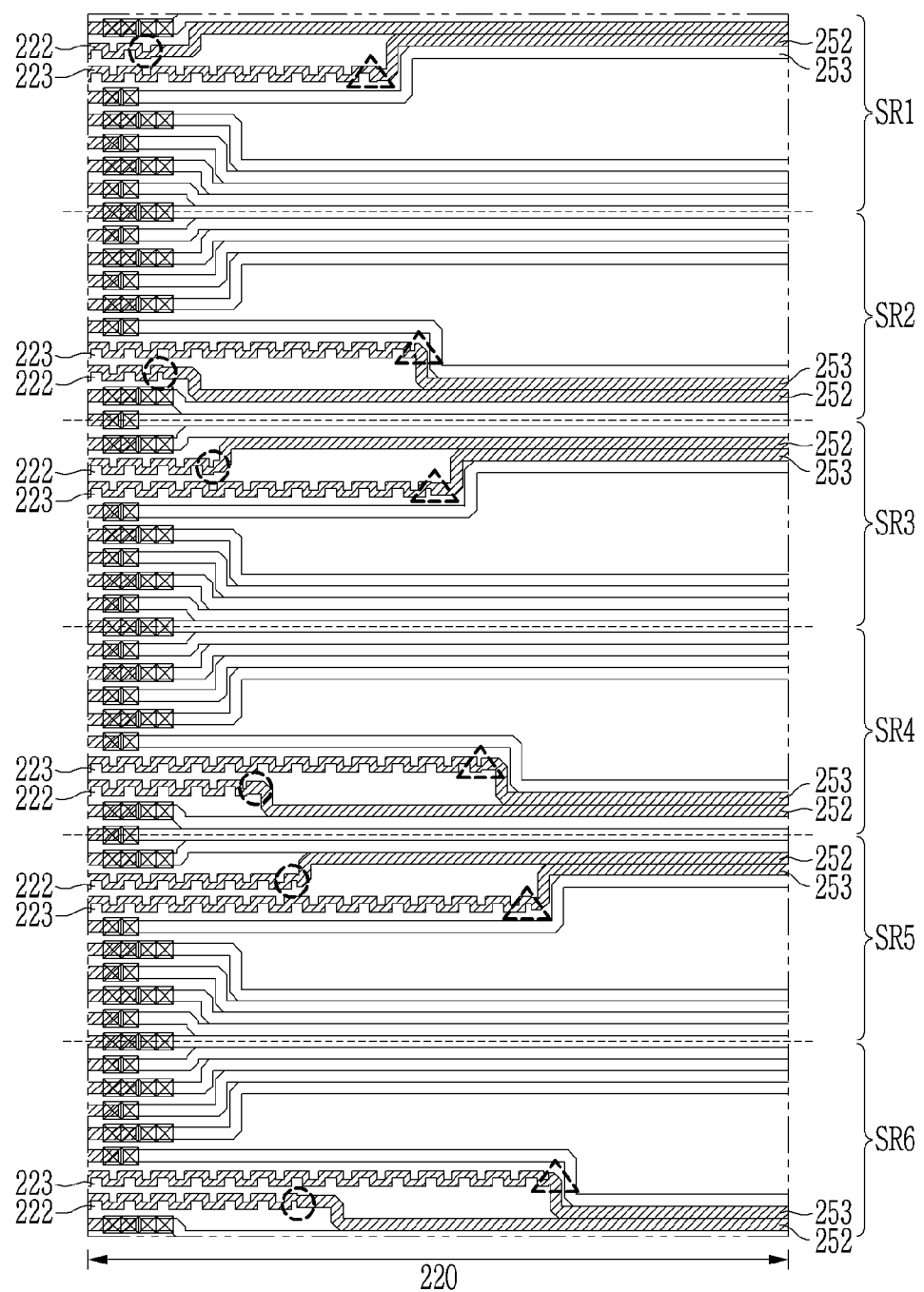
FIG. 12 illustrates a plan view of a partial region in a case where a resistance adjusting circuit includes wires having same resistance according to another exemplary embodiment.

In this case, scan and sensing signals that are sequentially delayed in phase by a predetermined interval are applied as for the first to fourth scan clock signals CLK1_SC to CLK4_SC and the first to fourth sensing clock signals CLK1_SS to CLK4_SS. A delay problem of each scan and sensing signal applied to each stage may be solved through the resistance adjusting circuit. In an exemplary embodiment, since a structure of the resistance adjusting circuit 220 is illustrated in FIG. 10 and FIG. 12, it will be described in detail below.

The first to third global clock terminals S_CK1, S_CK2, and S_CK3 receive global clock signals S_CLK1 to S_CLK3, respectively. The global clock signals of the present exemplary embodiment refer to a DC voltage (DC) signal applied to a gate driving circuit.

The first input terminal IN1 receives a sensing start signal SSP, the second input terminal IN2 and the third input terminal IN3 receive global signals SEN_ON and DIS_ON, and the fourth input terminal IN4 receives a sensing signal applied from the third output terminal CR of the next stage (e.g., if a current stage is SR1, the next stage is SR2).

The first voltage input terminal V1 receives a high level voltage VGH, the second voltage input terminal V2 receives a first low level voltage VGL1, and the third voltage input terminal V3 receives a second low level voltage VGL2.

The first output terminal OUT1 outputs a scan signal SC to a gate-embedded circuit, and the second output terminal OUT2 outputs a sensing signal SC to a gate-embedded circuit.

The third output terminal CR applies a sensing start signal to the first input terminal INT1 of the next.

Hereinafter, a detailed description will be given of a resistance adjusting circuit 220 in which an equivalent resistance design of a gate driver 200 is implemented.

FIG. 6 illustrates a connection relationship between a clock wiring circuit and a gate driving circuit in a gate driver according to an exemplary embodiment.

Referring to FIG. 6, the clock wiring circuit 210 of the gate driver 200 includes a plurality of carry clock signal lines CLK_CR, sensing clock signal lines CLK_SS, scan clock signal lines CLK_SC, and global clock signal lines CLK_GB. In this exemplary embodiment, each of the signal lines includes six signal lines extending in the first direction DR1. In FIG. 6, six signal lines of first to sixth carry clock signal lines CLK_CR1 to CLK_CR6, first to sixth sensing clock signal lines CLK_SS1 to CLK_SS6, first to sixth scan clock signal lines CLK_SC1 to CLK_SC6, and first to sixth global clock signal lines CLK_GB1 to CLK_GB6 are illustrated as 1, 2, 3, 4, 5, and 6 under the characters CLK_CR, CLK_SC, and CLK_GB, respectively, for convenience of illustration. In this exemplary embodiment, six sensing clock signal lines CLK_SS1, SS2, SS3, SS4, SS5, and SS6 are disposed at a right side of the six carry clock signal lines CLK_CR1, CR2, CR3, CR4, CR5, and CR6, six scan clock signal lines CLK_SC1, SC2, SC3, SC4, SC5, and SC6 are disposed at a right side of the sensing clock signal line CLK_SS, and six global clock signal lines CLK_GB1, GB2, GB3, GB4, GB5, and GB6 are disposed at a right side of the scan clock signal lines CLK_SC. According to an exemplary embodiment, positions of the carry clock signal lines CLK_CR, the sensing clock signal lines CLK_SS, the scan clock signal lines CLK_SC, and the global clock signal lines CLK_GB may be changed, and the number of each signal line may be variously implemented.

Each of the first to sixth carry clock signal lines CLK_CR1, CR2, CR3, CR4, CR5, and CR6 extends in the first direction DR1 at a predetermined distance apart. The first carry clock signal line CLK_CR1 is electrically connected to a first carry clock signal connection line 211 extending in the second direction DR2, and each of the second to sixth carry clock signal lines CLK_CR2, CR3, CR4, CR5, and CR6 are also electrically connected to a corresponding carry clock signal connection line extending in the second direction DR2. The first carry signal connection line 211 is connected to the first stage SR1 to transfer a first carry signal from the first carry clock signal line CLK_CR1 to the first stage SR1. The other carry signal connection lines are connected to one corresponding stage SR to transfer carry signals from one carry clock signal line CLK_CR.

Each of the first to sixth sensing clock signal lines CLK_SS1, SS2, SS3, SS4, SS5, and SS6 extends in the first direction DR1 at a predetermined distance apart. The first sensing clock signal line CLK_SS1 is electrically connected to a first sensing signal connection line 212 extending in the second direction DR2 to transfer the first sensing signal to the first stage SR1. Each of the other sensing clock signal lines is also electrically connected to one corresponding sensing signal connection line extending in the second direction DR2 to transmit a sensing signal to each corresponding stage SR. Herein, the first sensing clock signal line CLK_SS1 may be referred to as a first signal line, and the first sensing signal connection line 212 may be referred to as a first signal connection line.

Each of the first to sixth scan clock signal lines CLK_SC1, SC2, SC3, SC4, SC5, and SC6 extends in the first direction DR1 at a predetermined distance apart. The first scan clock signal line CLK_SC1 is electrically connected to a first scan signal connection line 213 extending in the second direction DR2 to transfer the first scan signal to the first stage SR1. Each of the other scan clock signal lines is also electrically connected to one corresponding scan signal connection line extending in the second direction DR2 to transmit a scan signal to each corresponding stage SR. Herein, the first scan clock signal line CLK_SC1 may be referred to as a second signal line, and the first scan signal connection line 213 may be referred to as a second signal connection line.

Each of the first to sixth global clock signal lines CLK_GB1, GB2, GB3, GB4, GB5, and GB6 extends in the first direction DR1 at a predetermined distance apart. The first to sixth global clock signal lines CLK_GB1, GB2, GB3, GB4, GB5, and GB6 are electrically connected to first to six global signal connection lines 214 extending in the second direction DR2, respectively, to transfer the first to sixth global signals to the first stage SR1. Corresponding connections to global clock signal lines CLK_GB are provided to the other stages SR2, SR3, . . . , and SR6.

Each of the stages SR1, SR2, SR3, SR4, SR5, and SR6 is connected to a corresponding carry clock signal line CLK_CR, a corresponding sensing clock signal line CLK_SS, a corresponding scan clock signal line CLK_SC, and six global clock signal lines CLK_GB1, GB2, GB3, GB4, GB5, and GB6. For example, nine clock signals may be applied to one stage. The signal connection lines that are connected to each stage SR by being connected to the carry clock signal line CLK_CR, the sensing clock signal line CLK_SS, the scan clock signal line CLK_SC, and six global clock signal lines CLK_GB1, GB2, GB3, GB4, GB5, and GB6 may be disposed over the clock wiring circuit 210 and the resistance adjusting circuit 220. Herein, each of the connection lines may include all the horizontal lines disposed over the clock wiring circuit 210 and the resistance adjusting circuit 220.

Since one sensing clock signal line CLK_SS and one scan clock signal line CLK_SC connected to one stage SR have different distances from the gate driving circuit 230, lengths of the connection lines extending in the second direction DR2 are different, and thus a resistance difference and an RC delay therefrom, that is, a signal delay, may occur. That is, a signal delay may occur due to the difference in length between the corresponding sensing signal connection line and the corresponding scan signal connection line. In general, the connection line connected to the clock signal circuit 210 disposed closer to the gate driving circuit 230 is longer than the connection line connected to the clock wiring circuit 210 disposed far from the gate driving circuit 230 in order to solve the signal delay by making the lengths of the two connection lines being the same. For example, the first scan signal connection line 213 of the scan clock signal line CLK_SC disposed close to the gate driving circuit 230 should be longer than the first sensing signal connection line 212 of the sensing clock signal line CLK-SS. In this case, a connection line including a winding concave-convex portion may be disposed in the resistance adjusting circuit 220 in order to increase a length of the first scan signal connection line 213. However, in a high resolution organic light emitting diode display, since it is necessary to include a plurality of elements in a limited area, there is a need for designing the resistance adjusting circuit 220 efficiently in a constant area without forming a long length of the connection line. That is, referring back to FIG. 4, it is necessary to design the resistance adjusting circuit 220 while a distance DS between a first end of the resistance adjusting circuit 220 and a first end of the gate driving circuit 230 as shown in FIG. 4 is constantly maintained.

Accordingly, in this exemplary embodiment, the resistance adjusting circuit 220 includes resistance wires having different resistivity, thereby maintaining the distance DS from the first end of the resistance adjusting circuit 220 to the first end of the gate driving circuit 230 and adjusting the resistance thereof.

Hereinafter, a resistance adjusting circuit 220 connected to a first stage and a second stage will be described with reference to FIG. 7 to FIG. 9.

Figure 7:
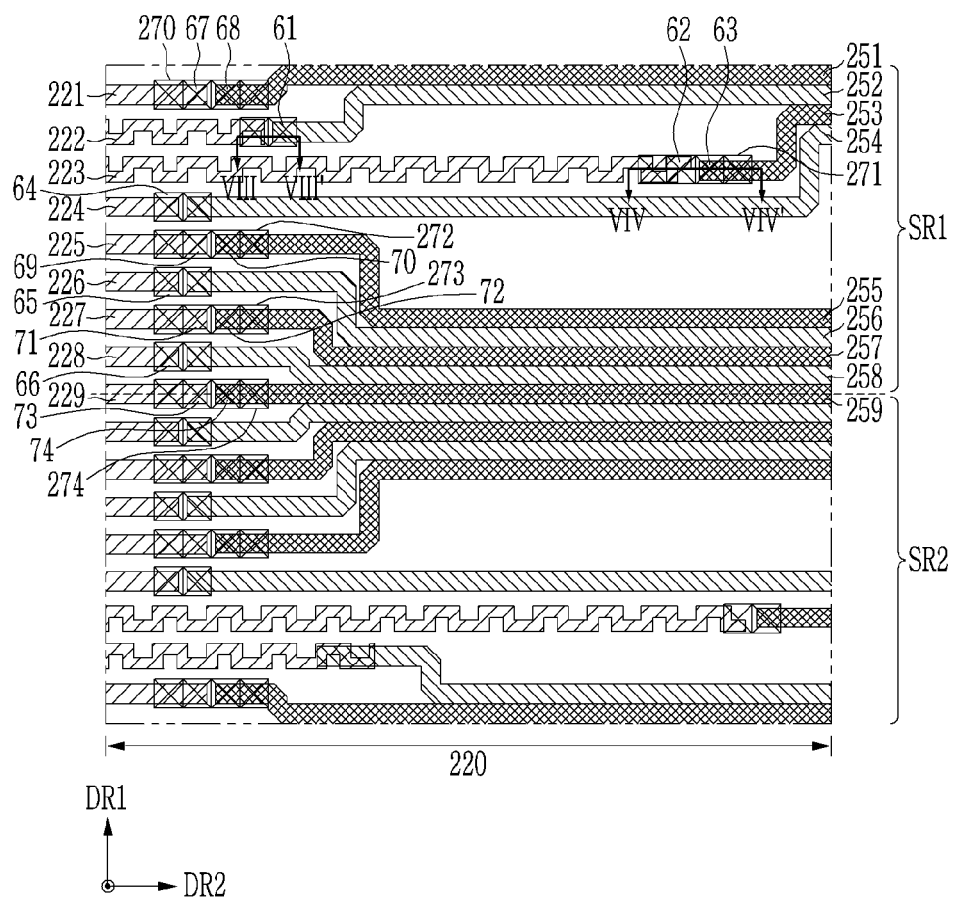
FIG. 7 illustrates a plan view of a partial region in a case where a resistance adjusting circuit includes wires having different resistivity according to an exemplary embodiment.
Figure 8:
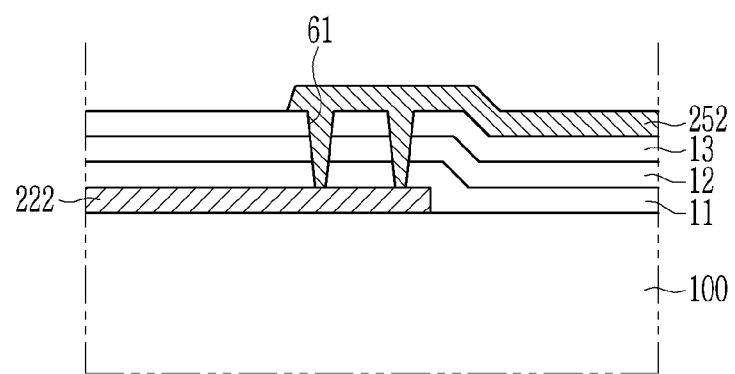
FIG. 8 illustrates a cross-sectional view taken along line VIII-VIII' of FIG. 7.
Figure 9:
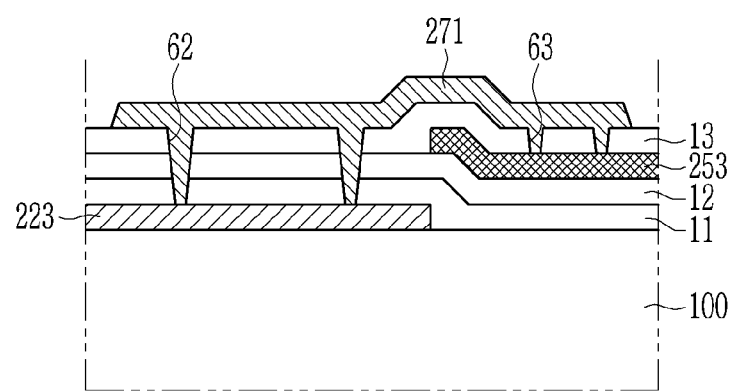
FIG. 9 illustrates a cross-sectional view taken along line VIV-VIV' of FIG. 7.

FIG. 7 illustrates a plan view of a partial region in a case where a resistance adjusting circuit 220 includes wires having different resistivity according to an exemplary embodiment, FIG. 8 illustrates a cross-sectional view taken along line VIII-VIII' of FIG. 7, and FIG. 9 illustrates a cross-sectional view taken along line VIV-VIV' of FIG. 7.

The resistance adjusting circuit 220 of the organic light emitting diode display according to an exemplary embodiment may include lower resistance lines 222, 223, 221, 224, 225, 226, 227, 228, and 229, a first insulating layer 11, a second insulating layer 12, and upper resistance lines 251, 253, 255, 257, and 259, an interlayer insulating layer 13, and data upper resistance lines 252, 271, 254, 256, 258, 270, 272, 273, and 274, which are disposed on the substrate 100. The upper resistance lines 251, 253, 255, 257, and 259 and the data upper resistance lines 252, 271, 254, 256, 258, 270, 272, 273, and 274 may be referred to as upper resistance lines, in an exemplary embodiment.

The substrate 100 may be made of a glass substrate or a flexible substrate including plastic and polyimide ("PI"). A barrier film made of an inorganic material may be disposed on the flexible substrate 100.

The lower resistance lines 222, 223, 221, 224, 225, 226, 227, 228, and 229 are disposed on the substrate 100. The lower resistance lines 222, 223, 221, 224, 225, 226, 227, 228, and 229 may include a first lower resistance line 222, a second lower resistance line 223, a first carry signal resistance line 221, and first to sixth global signal resistance lines 224, 225, 226, 227, 228, and 229. Herein, the first lower resistance line 222, the second lower resistance line 223, the first carry signal resistance line 221, and the first to sixth global signal resistance lines 224, 225, 226, 227, 228, and 229 show the connection lines connected to one stage. One first lower resistance line 222, one second lower resistance line 223, one first carry signal resistance line 221, and first to sixth global signal resistance lines 224, 225, 226, 227, 228, and 229 may be connected to the same stage. The lower resistance lines 222, 223, 221, 224, 225, 226, 227, 228, and 229 may be formed of or include a metal having resistivity of about 0.066 Ohms (Ω), for example. The lower resistance lines 222, 223, 221, 224, 225, 226, 227, 228, and 229 may be disposed in the same layer as the first carry signal connection line 211, the first scan signal connection line 213, the first sensing signal connection line 212, and the first to sixth global signal connection lines 214. The lower resistance lines 222, 223, 221, 224, 225, 226, 227, 228, and 229 may be a part of the first carry signal connection line 211, the first scan signal connection line 213, the first sensing signal connection line 212, and the first to sixth global signal connection lines 214, which are extended in the second direction DR2 in the clock wiring circuit 210.

The resistance adjusting circuit 220 of the first sensing signal connection line 212 includes a first lower resistance line 222 and a first upper resistance line 252. The first lower resistance line 222 is a resistance line extending in the second direction DR2 from the resistance adjusting circuit 220. The first lower resistance line 222 is electrically connected to the first upper resistance line 252, which will be described later, to transfer a first sensing signal. The first lower resistance line 222 includes a winding concave-convex portion.

The resistance adjusting circuit 220 of the first scan signal connection line 213 includes a second lower resistance line 223 and a second upper resistance line 253. The second lower resistance line 223 is a resistance line extending in the second direction DR2 from the resistance adjusting circuit 220. The second lower resistance line 223 is electrically connected to the second upper resistance line 253, which will be described later, to transfer a first scan signal. The second lower resistance line 223 includes a winding concave-convex portion, and the winding concave-convex portion of the second lower resistance line 223 is longer than the first lower resistance line 222. In another exemplary embodiment, heights of the concave-convex portions of the first lower resistance line 222 and the second lower resistance line 222 itself may be higher than those shown in FIG. 7 in regions not overlapping other wires in a plan view. Accordingly, the resistance lines may be efficiently disposed in a fixed area.

Herein, the lengths of the first lower resistance line 222 and the second lower resistance line 223 may vary depending on delays of the first sensing signal and the first scan signal. In the exemplary embodiment shown in FIG. 6, the sensing clock signal line CLK_SS is disposed farther to the gate driving circuit 230 than the scan clock signal line CLK_SC, and a number of other signal lines extending in the first direction DR1 that the first sensing signal connection line 212 overlaps (i.e., intersects) is greater than a number of other signal lines that the first scan signal connection line 213 overlaps in a plan view. Thus, since the first scan signal has a lesser signal delay than the first sensing signal, the first lower resistance line 222 having large resistivity may be shorter than the second lower resistance line 223, thereby reducing a deviation between the delay of the first sensing signal and the delay of the first scan signal. According to another exemplary embodiment, in the cases that the first sensing clock signal line CLK-SS1 is disposed to be closer to the gate driving circuit 230 than the first scan clock signal line CLK_SC1, the number of other signal lines extending in the first direction DR1 that the first scan signal connection line 213 overlaps (i.e., intersects) may be greater than the number of other signal lines that the first sensing signal connection line 212 overlaps. Thus, since the first sensing signal has a lesser signal delay than the first scan signal, the first lower resistance line 222 having large resistivity may be longer than the second lower resistance line 223, thereby reducing a deviation between the delay of the first sensing signal and the delay of the first scan signal.

The resistance adjusting circuit 220 of the first carry signal connection line 211 includes a first carry signal resistance line 221 and a first gate upper resistance line 251. The first carry signal resistance line 221 is a resistance line extending in the second direction DR2 from the resistance adjusting circuit 220. The first carry signal resistance line 221 is electrically connected to a first gate upper resistance line 251, which will be described later, to transfer a first carry signal.

The resistance adjusting circuit 220 of the first to sixth global signal connection lines 214 may include first to sixth global signal resistance lines 224, 225, 226, 227, 228, and 229, second to fourth gate upper resistance lines 255, 257, and 259, first to third data upper resistance lines 254, 256, and 268, and second to fourth gate connections 272, 273 and 274. The first to sixth global signal resistance lines 224, 225, 226, 227, 228, and 229 are six resistance wires extending from the resistance adjusting circuit 220 in the second direction DR2. The first global signal resistance line 224 is electrically connected to a first data upper resistance line 254 to be described later to transfer a first global signal, and the second global signal resistance line 225 is electrically connected to a second gate upper resistance line 255 which will be described later, to transmit a second global signal. The third global signal resistance line 226 is electrically connected to the second data upper resistance line 256, which will be described later, to transfer a third global signal. The fourth global signal resistance line 227 is electrically connected to a third gate upper resistance line 257 to be described later to transfer a fourth global signal, and the fifth global signal resistance line 228 is electrically connected to a third data upper resistance line 258 to be described later to transfer a fifth global signal. The sixth global signal resistance line 229 is electrically connected to a fourth gate upper resistance line 259 to be described later to transfer a sixth global signal. In addition, the sixth global signal resistance line 229 and the fourth gate upper resistance line 259 are connected to both the first stage SR1 and the second stage SR2, to commonly transfer a sixth global signal to the first stage SR1 and the second stage SR2.

The first insulating layer 11 and the second insulating layer 12 are disposed on the lower resistance lines 222, 223, 221, 224, 225, 226, 227, 228, and 229, and may be made of a silicon oxide ($SiO_2$) or a silicon nitride (SiNx) including an inorganic material. The first insulating layer 11 and the second insulating layer 12 may be collectively referred to as an insulating layer.

Upper resistance lines 251, 253, 255, 257, and 259 are disposed on the second insulating layer 12 (See FIG. 9). The upper resistance lines 251, 253, 255, 257, and 259 include a second upper resistance line 253 and first to fourth gate upper resistance lines 251, 255, 257, and 259. Herein, the second upper resistance line 253 and the first to fourth gate upper resistance lines 251, 255, 257, and 259 represent resistance lines connected to one stage. One second upper resistance line 253 and first to fourth gate upper resistance lines 251, 255, 257, and 259 may be connected to one of the plurality of stages. The upper resistance lines may be made of a metal having a resistivity of about 0.033Ω, for example.

The second upper resistance line 253 is a portion of the resistance line to which the first scan signal is transferred. The second upper resistance line 253 extends from a first end of the second lower resistance line 223 in the second direction DR2, and includes a curved line portion in a plan view. Specifically, referring to FIG. 7, a first end of the second upper resistance line 253 and the first end of the second lower resistance line 223 may not overlap each other. The second upper resistance line 253 may be electrically connected to the second lower resistance line 223 by a resistance line connector 271 which will be described later. The second upper resistance line 253 having resistivity that is smaller than that of the second lower resistance line 223 may have a short length corresponding to a length of the second lower resistance line 223 formed to be long. Accordingly, an area of the resistance adjusting circuit 220 may be constantly maintained. In addition, the second upper resistance line 253 may be formed of a wire including a concave-convex portion having a wide width depending on the disposal of the first upper resistance line 252 formed at an upper side in a plan view. Accordingly, an area of the resistance wiring may be efficiently utilized without increasing the area in the resistance adjusting circuit 220.

The first gate upper resistance line 251 is a portion of the resistance line to which the first carry signal is transferred. The first gate upper resistance line 251 extends from a first end of the first carry signal resistance line 221 in the second direction DR2, and includes a curved line portion in a plan view. A first end of the first carry signal resistance line 221 and the first end of the first gate upper resistance line 251 may not overlap each other. Herein, the first gate upper resistance line 251 may be electrically connected to the first carry signal resistance line 221 by a first gate connector 270 which will be described later.

The second gate upper resistance line 255 is a portion of the resistance line to which the second global signal is transferred. The second gate upper resistance line 255 extends from a first end of the second global signal resistance line 225 in the second direction DR2, and includes a curved line portion in a plan view. A first end of the second gate upper resistance line 255 and a first end of the second global signal resistance line 225 may not overlap each other. The second gate upper resistance line 255 is electrically connected to the second global signal resistance line 225 by a second gate connector 272.

The third gate upper resistance line 257 is a portion of the resistance line to which the fourth global signal is transferred. The third gate upper resistance line 257 extends from a first end of the fourth global signal resistance line 227 in the second direction DR2, and includes a curved line portion in a plan view. The third gate upper resistance line 257 is electrically connected to the fourth global signal resistance line 227 by a third gate connector 273.

The fourth gate upper resistance line 259 is a portion of the resistance line to which the sixth global signal is transferred. The fourth gate upper resistance line 259 is electrically connected to the sixth global signal resistance line 229 by a fourth gate connector 274. The sixth global signal resistance line 229 and the fourth gate upper resistance line 259 are connected to both the first stage SR1 and the second stage SR2, to commonly transfer a sixth global signal to the first stage SR1 and the second stage SR2.

The interlayer insulating layer 13 is disposed on the upper resistance lines 251, 253, 255, 257, and 259 (Refer to FIG. 9), and may be made of an organic material or an inorganic material.

The data upper resistance lines 252, 271, 254, 256, 258, 270, 272, 273, and 274 are disposed on the interlayer insulating layer 13. The data upper resistance lines 252, 271, 254, 256, 258, 270, 272, 273, and 274 may include a first upper resistance line 252, a resistance line connector 271, first to third data upper resistance lines 254, 256, and 258, and first to fourth gate connections 270, 272, 273, and 274. Herein, the first upper resistance line 252, the resistance line connector 271, the first to third data upper resistance lines 254, 256, and 258, and the first to fourth gate connectors 270, 272, 273, and 274 represent resistance lines connected to one stage. The first upper resistance line 252, the resistance line connector 271, the first to third data upper resistance lines 254, 256, and 258, and the first to fourth gate connectors 270 and 272, 273, and 274 may be connected to one stage SR of the plurality of stages SR. The data upper resistance lines may be formed of or include a metal having a resistivity of about 0.033Ω, for example.

The first upper resistance line 252 is a resistance line extending in the second direction DR2. The first upper resistance line 252 is partially overlapped with the first lower resistance line 222. Specifically, referring to FIG. 8, the first upper resistance line 252 is electrically connected to the first lower resistance line 222 through an opening 61 defined in the first insulating layer 11, the second insulating layer 12, and the interlayer insulating layer 13 to transfer the first sensing signal. The first upper resistance line 252 includes a partially curved line portion in a plan view, and may have a long length corresponding to a short length of the first lower resistance line 222. Accordingly, an area of the resistance adjusting circuit 220 may be constantly maintained.

The resistance line connector 271 is disposed to extend in the second direction DR2, and partially overlaps the second lower resistance line 223 and the second upper resistance line 253 in a plan view. Specifically, referring to FIG. 8, the resistance line connector 271 and the second lower resistance line 223 are electrically connected to each other through an opening 62 defined in the first insulating layer 11, the second insulating layer 12, and the interlayer insulating layer 13 in a portion where the resistance line connector 271 and the second lower resistance line 223 overlap each other in a plan view. The resistance line connector 271 and the second upper resistance line 253 are electrically connected to each other through an opening 63 defined in the first insulating layer 11, the second insulating layer 12, and the interlayer insulating layer 13 in a portion where the resistance line connector 271 and the second upper resistance line 253 overlap each other in a plan view. That is, the first scan signal transferred to the second lower resistance line 223 may be connected to the second upper resistance line 253 through the resistance line connector 271.

The first to third data upper resistance lines 254, 256, and 258 extend in the second direction DR2, and are part of the resistance line through which the first, third, and fifth global signals are transferred. The first to third data upper resistance lines 254, 256, and 258 include a partially curved line portion in a plan view. The first to third data upper resistance lines 254, 256, and 258 overlap with portions of the first global signal resistance line 224, the third global signal resistance line 226, and the fifth global signal resistance line 228. Portions where the first to third data upper resistance lines 254, 256, and 258 and the first, third, and fifth global signal resistance lines 224, 226, and 228 overlap each other respectively may be electrically connected to each other through opening 64, 65, and 66 defined in the first insulating layer 11, the second insulating layer 12, and the interlayer insulating layer 13, respectively (Refer FIG. 7).

The first gate connector 270 is disposed to extend in the second direction DR2, and is a connector that transfers a first carry signal. The first gate connector 270 partially overlaps the first carry signal resistance line 221 and the first gate upper resistance line 251 in a plan view. The first carry signal resistance line 221 may be electrically connected to the first gate connection part 270 through an opening 67 defined in the first insulating layer 11, the second insulating layer 12, and the interlayer insulating layer 13, and may be electrically connected to the first gate upper resistance line 251 through an opening 68 defined in the interlayer insulating layer 13.

The second to fourth gate connectors 272, 273, and 274 are disposed to extend in the second direction DR2, and are connectors that transfer second, fourth, and sixth global signals. The second to fourth gate connections 272, 273, and 274 partially overlap the second, fourth, and sixth global signal resistance lines 225, 227, and 229, respectively, and are electrically connected to each other through openings 69, 71, and 73, respectively, defined in the first insulating layer 11, the second insulating layer 12, and the interlayer insulating layer 13. In addition, the second to fourth gate connectors 272, 273, and 274 are partially overlapped with the second to fourth gate upper resistance lines 255, 257, and 259, respectively, and are electrically connected to each other through openings 70, 72, and 74, respectively, defined in the interlayer insulating layer 13.

Although not illustrated in FIG. 8 and FIG. 9, according to an exemplary embodiment, the first upper resistance line 252 may be formed at the same layer as the gate connector to be electrically connected to the first lower resistance line 252 through an opening defined in the second insulating layer 12. The second upper resistance line 253 may be directly electrically connected to the second lower resistance line 223 without the resistance line connector 271.

Referring to FIG. 7 again, one first gate upper resistance line 251, the first upper resistance line 252, the second upper resistance line 253, the second to fourth gate upper resistance 255, 257, and 259, and the first to third data upper resistance 254, 256, and 258 which are connected to the first stage SR1 may be connected to the second stage SR2. In addition, the first gate upper resistance line 251, the first upper resistance line 252, the second upper resistance line 253, the second to fourth gate upper resistance lines 255, 257, and 259, and the first to third data upper resistance lines 254, 256, and 258 may be disposed to be connected symmetrically with respect to the second stage SR2 about the fourth data upper resistance line 254.

Although not illustrated in FIG. 7, the carry clock signal line CLK_CR, the sensing clock signal line CLK_SS, the scan clock signal line CLK_SC, and the global clock signal line CLK_GB extending in the second direction DR2 may be disposed in the same layer as the data upper resistance lines 252, 271, 254, 256, 258, 270, 272, 273, and 274.

Hereinafter, a state of the resistance adjusting circuit connected to first to sixth stages will be described with reference to FIG. 10. Referring again to FIG. 7, the gate driving circuit 230 disposed at a right side of the resistance adjusting circuit 220 includes first to sixth stages SR1, SR2, SR3, SR4, SR5, and SR6. The first gate upper resistance line 251, the first upper resistance line 252, the second upper resistance line 253, the second to fourth gate upper resistance lines 255, 257, and 259, and the first to third data upper resistance lines 254, 256, and 258 are directly connected to one stage SR. The first gate upper resistance line 251, the first upper resistance line 252, the second upper resistance line 253, the second to fourth gate upper resistance lines 255, 257, and 259, and the first to third data upper resistance lines 254, 256, and 258 are connected to the first stage SR1, the third stage SR3, and the fifth stage SR5, that is, the odd-numbered stages. On the other hand, the resistance lines connected to the odd-numbered stages are symmetrically connected to the second stage SR2, the fourth stage SR4, and the sixth stage SR6, that is, the even-numbered stages, such that a bottom resistance line connected to the odd-numbered stages is connected at the top to the even-numbered stages in that order of the resistance lines. Herein, a third data upper resistance line 258 may be connected to the odd stage SR and the even stage SR together.

When the gate driving circuit 230 according to an exemplary embodiment sequentially outputs a gate signal from the sixth stage SR6 to the first stage SR1 and from the bottom stage to the top stage, a delay of the clock signal may occur going from the bottom stage to the top stage. The first lower resistance line 222 and the second lower resistance line 223 connected to the sixth stage SR6 are longest compared with the first and second lower resistance lines 222 and 223 connected to the first to fifth stages SR1, SR2, SR3, SR4, and SR5 in order to prevent such a signal delay. On the other hand, since the lengths of the first and second upper resistance lines 252 and 253 connected to the sixth stage SR6 are short, an output signal delayed in the first stage SR1 may be adjusted. That is, the first and second lower resistance lines 222 and 223 connected to the first stage SR1 are the shortest compared with the first and second lower resistance lines 222 and 223 connected to the second to sixth stages SR2, SR3, SR4, SR5, and SR6. Accordingly, the first and second upper resistance lines 252 and 253 connected to the first stage SR1 may be longer than those connected to the second to sixth stages SR2, SR3, SR4, SR5, and SR6, thereby constantly maintaining overall resistance of the resistance adjusting circuit 220.

Positions of openings along lengths of the first lower resistance line 222, the first upper resistance line 252, the second lower resistance line 223, and the second upper resistance line 253 will now be described. As the stage number increases from the first stage SR1 to the sixth stage SR6, the position of the opening in which the first lower resistance line 222 and the first upper resistance line 252 are connected gradually moves to the right (indicated by circles in FIG. 10). In addition, as the stage number increases from the first stage SR1 to the sixth stage SR6, the position of the opening in which the second lower resistance line 223 and the second upper resistance line 253 are connected also gradually moves to the right (indicated by triangles in FIG. 10).

Therefore, it is possible to design appropriate resistance by adjusting lengths of the first and second upper resistance lines 252 and 253 and the first and second lower resistance lines 222 and 223 having different resistivity without changing the area of the resistance adjusting circuit.

Although not illustrated in FIG. 10, according to an exemplary embodiment, when gate signals are sequentially outputted from the bottom stage to the top stage among the plurality of stages, the first carry signal resistance line 221 connected to the first stage SR1 is shortest compared with the first carry signal resistance line 221 connected to the second to sixth stages SR2, SR3, SR4, SR5, and SR6. Each carry signal resistance line connected to the second to sixth stages SR2, SR3, SR4, SR5, and SR6 may be gradually longer, thereby constantly maintaining overall resistance of the resistance adjusting circuit 220 and preventing the carry clock signal applied to the stages from being delayed.

Hereinafter, a state in which wires having constant resistivity are included in a resistance adjusting circuit according to another exemplary embodiment will be described with reference to FIG. 11 and FIG. 12.

Figure 11:
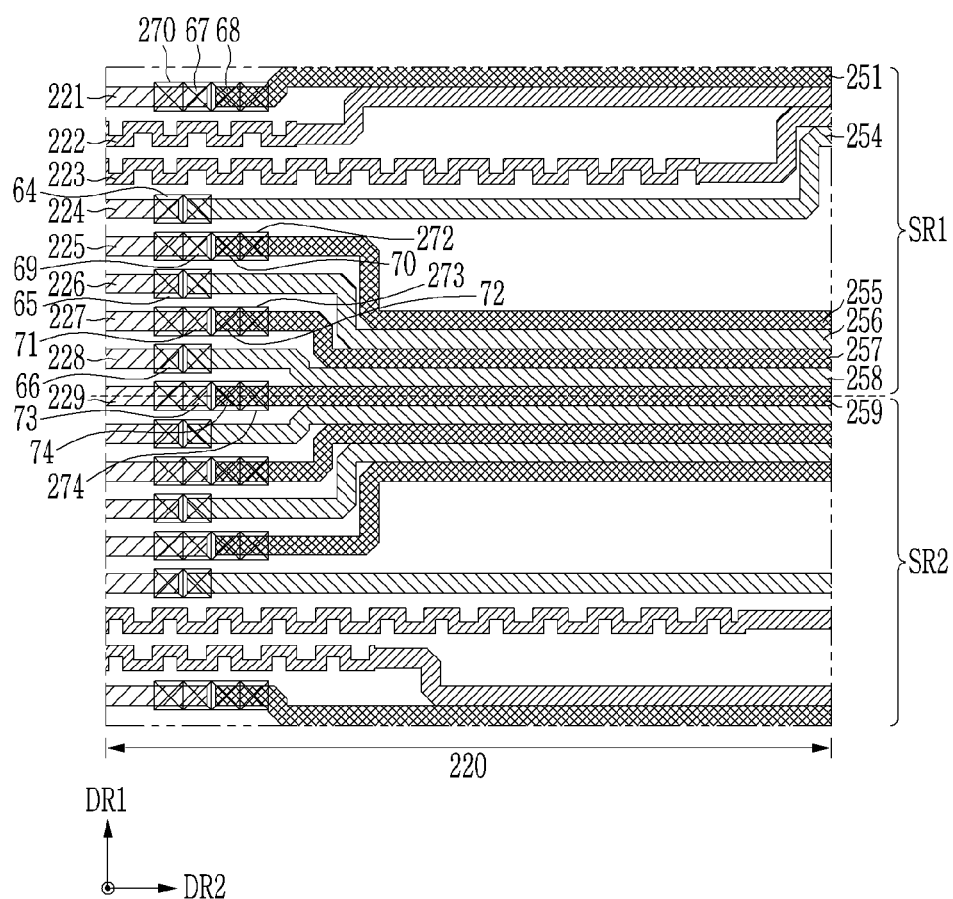
FIG. 11 illustrates a plan view of a partial region in a case where a resistance adjusting circuit includes wires having same resistance according to another exemplary embodiment.

FIG. 11 illustrates a plan view of a partial region in a case where a resistance adjusting circuit includes wires having the same resistance according to another exemplary embodiment, and FIG. 12 illustrates a plan view of a partial region in a case where a resistance adjusting circuit includes wires having the same resistance according to another exemplary embodiment.

FIG. 11 is similar to the resistance adjusting circuit according to the exemplary embodiment shown in FIG. 7, and therefore, the following description will focus on differences.

Referring to FIG. 11, the resistance adjusting circuit 220 of the organic light emitting diode display according to another exemplary embodiment may include lower resistance lines 222, 223, 221, 224, 225, 226, 227, 228, and 229, the first insulating layer 11, the second insulating layer 12, and the upper resistance lines 251, 255, 257, and 259, the interlayer insulating layer 13, and data upper resistance lines 254, 256, 258, 270, 272, 273, and 274 which are disposed on the substrate 100.

The resistance adjusting circuit 220 of the first sensing signal connection line 212 includes a first lower resistance line 222. The first lower resistance line 222 is a resistance line extending in the second direction DR2 from the resistance adjusting circuit 220 to transfer a first sensing signal. The first lower resistance line 222 includes a winding concave-convex portion. Herein, the first lower resistance line is referred to as a first resistance line.

The resistance adjusting circuit 220 of the first scan signal connection line 213 includes a second lower resistance line 223. The second lower resistance line 223 is a resistance line extending in the second direction DR2 from the resistance adjusting circuit 220 to transfer a first scan signal. The second lower resistance line 223 includes a winding concave-convex portion, and the winding concave-convex portion is longer than the first lower resistance line 222. Herein, the second lower resistance line is referred to as a second resistance line.

According to an exemplary embodiment, the first lower resistance line 222 and the second lower resistance line 223 may be disposed between the first insulating layer 11 and the second insulating layer 12, and may be disposed on the second insulating layer 12 or the interlayer insulating layer 13. That is, the first lower resistance line 222 and the second lower resistance line 223 positioned in the resistance adjusting circuit 220 may be implemented by wires having the same resistivity, thereby reducing delay deviations of delays of the first sensing signal and the scan signal depending on a length of the concave-convex portion.

In addition, heights of the concave-convex portions of the first lower resistance line 222 and the second lower resistance line 222 may be higher than those shown in FIG. 11 in regions not overlapping other wires in a plan view. Accordingly, the resistance lines may be efficiently disposed in a fixed area.

FIG. 12 is similar to the resistance adjusting circuit according to the exemplary embodiment shown in FIG. 10, and therefore, the following description will focus on differences.

When the gate driving circuit 230 according to an exemplary embodiment sequentially outputs a gate signal from the sixth stage SR6 to the first stage SR1 and from the bottom stage to the top stage, a delay of the clock signal may occur going from the bottom stage to the top stage. The first lower resistance line 222 and the second lower resistance line 223 connected to the sixth stage SR6 are longest compared with the first and second lower resistance lines 222 and 223 connected to the first to fifth stages SR1, SR2, SR3, SR4, and SR5 in order to prevent such a signal delay.

A position of a first end of the concave-convex portion included in the first lower resistance line 222 and the second lower resistance line 223 will now be described. When connected to one from the first stage SR1 to the sixth stage SR6, the position of first end of the concave-convex portion of the first lower resistance line 222 gradually moves to the right (indicated by circles in FIG. 12). In addition, when connected to one from the first stage SR1 to the sixth stage SR6, the position of first end of the concave-convex portion of the second lower resistance line 223 also gradually moves to the right (indicated by triangles in FIG. 12).

According to an exemplary embodiment, the first lower resistance line 222 and the second lower resistance line 223 may be disposed between the first insulating layer 11 and the second insulating layer 12, and may be disposed on the second insulating layer 12 or the interlayer insulating layer 13. That is, the first lower resistance line 222 and the second lower resistance line 223 positioned in the resistance adjusting circuit 220 may be implemented by wires having the same resistivity, thereby reducing delays of the sensing signal and the scan signal depending on a length of the concave-convex portion.

In addition, heights of the concave-convex portions of the first lower resistance line 222 and the second lower resistance line 222 may be higher than those shown in FIG. 12 in regions not overlapping other wires in a plan view. Accordingly, the resistance lines may be efficiently disposed in a fixed area.

Hereinafter, a cross-sectional view of a display area of an organic light emitting diode display according to an exemplary embodiment will be described with reference to FIG. 13.

Figure 13:
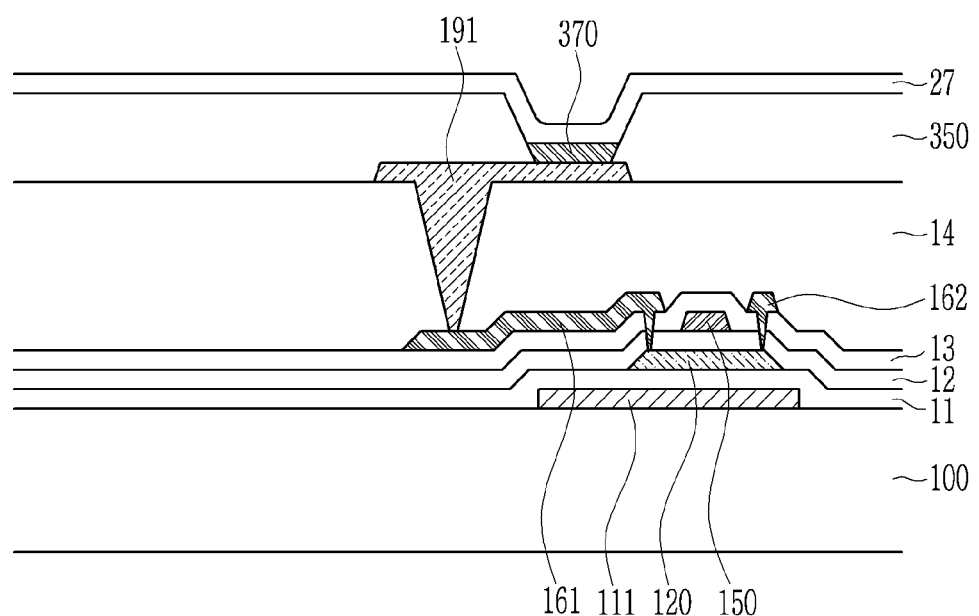
FIG. 13 illustrates a cross-sectional view of a display area of an organic light emitting diode display according to an exemplary embodiment.

Referring to FIG. 13, an organic light emitting diode display according to an exemplary embodiment includes a lower metal layer 111, a first insulating layer 11, a semiconductor layer 120, a second insulating layer 12, a gate electrode 150, an interlayer insulating layer 13, a source electrode 161, a drain electrode 162, a planarization layer 14, and an organic light emitting diode OLED which are sequentially stacked on a substrate 100.

The substrate 100 may be a flexible substrate 100 including plastic and polyimide (PI). A barrier layer made of an inorganic material may be disposed on the substrate 100.

The lower metal layer 111 is disposed on the substrate 100. The lower metal layer 111, which is a metal layer disposed in the display area DA including the pixel PX, may be disposed in the same layer as lower resistance lines 222, 223, 221, 224, 225, 226, 227, 228, and 229 illustrated in FIG. 6 to FIG. 10, disposed in the non-display area NA, a carry signal connection line, a scan signal connection line, a sensing signal connection line, and a plurality of global signal connection lines.

The first insulating layer 11 is disposed on the lower metal layer 111, and may be made of an inorganic material.

The semiconductor layer 120 is disposed on the first insulating layer 11 and may include polycrystalline silicon, an oxide semiconductor material, and amorphous silicon.

The semiconductor layer 120 includes a source region, a drain region, and a channel region, wherein the source region and the drain region are doped with impurities, and the channel region is not doped with impurities.

The second insulating layer 12 is disposed on the semiconductor layer 120, and may be made of an inorganic material.

The gate electrode 150 may be disposed on the second insulating layer 12. The gate electrode 150 may be disposed to overlap a channel region of the semiconductor layer 120.

The interlayer insulating layer 13 is disposed on the gate electrode 150, and may be made of an organic material or an inorganic material.

The source electrode 161 and the drain electrode 162 are disposed on the interlayer insulating layer 13, and may be electrically connected to the source region and the drain region of the semiconductor layer 120. In this case, the source electrode 161 and the drain electrode 162 connected to the semiconductor layer 120 may form one thin film transistor together with the gate electrode 150. The source electrode 161 and the drain electrode 162 may be disposed in the same layer as a carry clock signal line CLK_CR, a sensing clock signal line CLK_SS, a scan clock signal line CLK_SC, and a global clock signal line CLK_GB extending in the second direction DR2.

The planarization layer 14 is disposed on the source electrode 161 and the drain electrode 162, and may be formed of or included an organic material.

The anode electrode 191 is disposed on the planarization layer 14. The anode electrode 191 may be formed of or include a transparent conductive material or a reflective metal. The anode electrode 191 may be electrically connected to the drain electrode 162 through an opening defined in the planarization layer 14 to serve as a pixel electrode of the organic light emitting diode OLED.

A partition wall 350 covers the anode electrode 191 and the planarization layer 14, and may be formed of or include an organic material.

An organic emission layer 370 is disposed in an open portion of the partition wall 350. The organic emission member 370 may include at least one of an emission layer, a hole injection layer (HIL), a hole transporting layer (HTL), an electron transporting layer (ETL), and an electron injection layer (EIL).

The cathode electrode 27 is disposed on the partition wall 350 and the organic light emitting layer 370. A cathode electrode 27 may be formed of or include a transparent conductive material or a reflective metal. The cathode electrode 27 may serve as a common electrode of the organic light emitting diode OLED. An anode electrode 191, the organic emission layer 370, and the cathode electrode 27 form an organic light emitting diode OLED.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: substrate
200: gate driver
300: printed circuit board (PCB)
310: FPBC
320: data driver
210: clock wiring circuit
220: resistance adjusting circuit
230: gate driving circuit
240: gate wiring circuit
SR1, SR2, SR3, SR4, SR5, SR6: first, second, third, fourth, fifth, and sixth stage
212: first sensing signal connection line
213: first scan signal connection line
211: first carry signal connection line
214: first to sixth global signal connection lines
222: first lower resistance line
223: second lower resistance line
252: first upper resistance line
253: second upper resistance line
271: resistance line connector

What is claimed is:

1. An organic light emitting diode display comprising:
    a substrate which includes a display area and a non-display area;
    an organic light emitting diode disposed in the display area;
    a plurality of transistors connected to the organic light emitting diode and disposed in the display area; and
    a gate driver disposed in the non-display area,
    wherein the gate driver includes:
        a clock wiring circuit which includes a first signal line and a second signal line extending in a first direction, respectively;
        a resistance adjusting circuit which includes a first lower resistance line and a first upper resistance line which are electrically connected to the first signal line, and a second lower resistance line and a second upper resistance line which are electrically connected to the second signal line, wherein the first lower resistance line is disposed between the first signal line and the first upper resistance line, and the second lower resistance line is disposed between the second signal line and the second upper resistance line; and
        a gate driving circuit connected to the resistance adjusting circuit and which includes a plurality of stages for applying a gate signal,
    wherein the second signal line is disposed closer to the gate driving circuit than the first signal line,
    the first lower resistance line has higher resistivity than the first upper resistance line, and the second lower resistance line has higher resistivity than the second upper resistance line,
    the first lower resistance line is shorter than the second lower resistance line, and
    the first upper resistance line is longer than the second upper resistance line,
    wherein the organic light emitting diode display further comprises:
        an insulating layer disposed on the first lower resistance line; and
        an interlayer insulating layer disposed on the insulating layer,
    wherein the first upper resistance line is positioned on the interlayer insulating layer, and the first lower resistance line is electrically connected to the first upper resistance line through an opening defined in the insulating layer and the interlayer insulating layer.

2. The organic light emitting diode display of claim 1, wherein each of the first lower resistance line and the second lower resistance line includes a winding concave-convex portion.

3. The organic light emitting diode display of claim 1, further comprising
a first signal connection line including a first portion extending in a second direction perpendicular to the first direction and electrically connected to the first signal line,
wherein the first lower resistance line is a second portion of the first signal connection line included in the resistance adjusting circuit.

4. The organic light emitting diode display of claim 2, wherein the first lower resistance line is positioned between the substrate and the insulating layer.

5. The organic light emitting diode display of claim 1, further comprising
a second signal connection line including a first portion extending in a second direction perpendicular to the first direction and electrically connected to the second signal line,
wherein the second lower resistance line iso a second portion of the second signal connection line included in the resistance adjusting circuit.

6. The organic light emitting diode display of claim 5, further comprising:
a resistance line connector disposed on the interlayer insulating layer,
wherein the insulating layer is disposed on the second lower resistance line,
the interlayer insulating layer is disposed on the second upper resistance line,
the second lower resistance line is positioned between the substrate and the insulating layer, and
the second upper resistance line is disposed between the insulating layer and the interlayer insulating layer.

7. The organic light emitting diode display of claim 6, wherein
the second lower resistance line is electrically connected to the resistance line connector through an opening defined in the insulating layer and the interlayer insulating layer, and
the second upper resistance line is electrically connected to the resistance line connector through an opening defined in the interlayer insulating layer.

8. An organic light emitting diode display comprising:
a substrate which includes a display area and a non-display area;
an organic light emitting diode disposed in the display area;
a plurality of transistors connected to the organic light emitting diode and disposed in the display area; and
a gate driver disposed in the non-display area,
wherein the gate driver includes:
 a clock wiring circuit which includes a first signal line and a second signal line extending in a first direction, respectively;
 a resistance adjusting circuit which includes a first resistance line electrically connected to the first signal line and a second resistance line electrically connected to the second signal line; and
 a gate driving circuit connected to the resistance adjusting circuit and which includes a plurality of stages for applying a gate signal,
wherein the second signal line is disposed closer to the gate driving circuit than the first signal line,
each of the first resistance line and the second resistance line includes a winding concave-convex portion,
the plurality of stages are arranged in the first direction,
a length of the concave-convex portion of the first resistance line in a second direction perpendicular to the first direction is shorter than a length of the concave-convex portion of the second resistance line in the second direction,
the second resistance line includes another portion between the concave-convex portion thereof and a stage of the plurality of stages,
the another portion of the second resistance line is disposed in a different conductive layer from the concave-convex portion of the second resistance line and is electrically connected to the concave-convex portion of the second resistance line through a contact hole, and
the concave-convex portion of the second resistance line does not overlap an end of the another portion directly connected to the stage in the second direction in a plan view.

9. The organic light emitting diode display of claim 8, further comprising
a first signal connection line including a first portion extending in the second direction and electrically connected to the first signal line,
wherein the first resistance line is a second portion of the first signal connection line included in the resistance adjusting circuit.

10. The organic light emitting diode display of claim 8, further comprising
a second signal connection line including a first portion extending in the second direction and electrically connected to the second signal line,
wherein the second resistance line is a second portion of the second signal connection line included in the resistance adjusting circuit.

11. The organic light emitting diode display of claim 8, further comprising:
an insulating layer disposed on the substrate; and
an interlayer insulating layer disposed on the insulating layer,
wherein the first resistance line or the second resistance line is disposed between the substrate and the insulating layer or disposed on the insulating layer.

12. The organic light emitting diode display of claim 8, further comprising
a gate wiring circuit disposed in the non-display area,
wherein the gate wiring circuit is electrically connected to the stage and applies the gate signal transferred from the stage to the pixel.

13. An organic light emitting diode display comprising:
a substrate which includes a display area and a non-display area;
a first lower resistance line and a second lower resistance line disposed in the non-display area;
an insulating layer disposed on the first lower resistance line and the second lower resistance line;
an upper resistance line disposed on the insulating layer; and
an interlayer insulating layer disposed on a portion of the upper resistance line,
wherein the upper resistance line includes a first upper resistance line disposed on a top surface of the interlayer insulating layer and a second upper resistance line disposed under a bottom surface of the interlayer insulating layer, the first lower resistance line is electrically connected to the first upper resistance line and has higher resistivity than the first upper resistance line, and the second lower resistance line is electrically connected to the second upper resistance line and has higher resistivity than the second upper resistance line, and the first lower resistance line is electrically connected to the first upper resistance line through an opening defined in the insulating layer and the interlayer insulating layer.

14. The organic light emitting diode display of claim 13, further comprising:
    a first signal line positioned on the interlayer insulating layer; and
    a first signal connection line electrically connected to the first signal line,
    wherein the first signal connection line includes a first portion disposed on a same layer as the first lower resistance line, and
    the first lower resistance line is a second portion of the first signal connection line.

15. The organic light emitting diode display of claim 14, further comprising:
    a second signal line positioned on the interlayer insulating layer; and
    a second signal connection line electrically connected to the second signal line,
    wherein the second signal connection line includes a first portion disposed on a same layer as the second lower resistance line, and
    the second lower resistance line is a second portion of the second signal connection line.

16. The organic light emitting diode display of claim 15, further comprising
    a resistance line connector disposed on the interlayer insulating layer,
    wherein the second lower resistance line is electrically connected to the resistance line connector through an opening defined in the insulating layer and the interlayer insulating layer,
    wherein the second upper resistance line is electrically connected to the resistance line connector through an opening defined in the interlayer insulating layer.

17. The organic light emitting diode display of claim 16, further comprising
    a carry clock signal line and a plurality of global clock signal lines disposed in the interlayer insulating layer, respectively,
    wherein a sensing signal is transferred to the first signal line, and
    a scan signal is transferred to the second signal line.

18. The organic light emitting diode display of claim 17, further comprising:
    a carry signal resistance line positioned between the substrate and the insulating layer;
    a gate upper resistance line disposed on the insulating layer;
    an interlayer insulating layer disposed on the gate upper resistance line; and
    a gate connector disposed on the interlayer insulating layer,
    wherein the carry signal resistance line is electrically connected to the gate upper resistance line through an opening defined in the insulating layer, and
    the gate upper resistance line is electrically connected to the gate connector through an opening defined in the interlayer insulating layer.

* * * * *